US012660099B2

(12) United States Patent
Kim et al.

(10) Patent No.: US 12,660,099 B2
(45) Date of Patent: Jun. 16, 2026

(54) ELECTRIC/ELECTRONIC EQUIPMENT AND METHOD FOR MANUFACTURING SAME

(71) Applicant: LG INNOTEK CO., LTD., Seoul (KR)

(72) Inventors: Min Oak Kim, Seoul (KR); Min Jung Shin, Seoul (KR); Woo Seok Lee, Seoul (KR); Ki Eun Yoon, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 85 days.

(21) Appl. No.: 18/555,460

(22) PCT Filed: Apr. 8, 2022

(86) PCT No.: PCT/KR2022/005092
§ 371 (c)(1),
(2) Date: Oct. 13, 2023

(87) PCT Pub. No.: WO2022/220494
PCT Pub. Date: Oct. 20, 2022

(65) Prior Publication Data
US 2024/0196548 A1 Jun. 13, 2024

(30) Foreign Application Priority Data

Apr. 13, 2021 (KR) ........................ 10-2021-0047961
Jan. 27, 2022 (KR) ........................ 10-2022-0012703

(51) Int. Cl.
*H05K 5/00* (2025.01)
(52) U.S. Cl.
CPC ........... *H05K 5/0052* (2013.01); *H05K 5/006* (2013.01)

(58) Field of Classification Search
None
See application file for complete search history.

(56) References Cited

U.S. PATENT DOCUMENTS 6,560,840 B1 *  5/2003  Jenkins ................. H02G 3/086
                                                269/54.5
8,226,871 B2 *  7/2012  Salvador ........... B29C 66/73152
                                                264/296

(Continued)

FOREIGN PATENT DOCUMENTS

CN      201018719 Y      2/2008
CN      102630365 A      8/2012

(Continued)

OTHER PUBLICATIONS

International Search Report dated Jul. 21, 2022 in International Application No. PCT/KR2022/005092.

(Continued)

*Primary Examiner* — James Wu
*Assistant Examiner* — Christopher L Augustin
(74) *Attorney, Agent, or Firm* — Saliwanchik, Lloyd & Eisenschenk

(57) ABSTRACT

Electric equipment comprises: a housing; a printed circuit board disposed in the housing and including a first hole; and a cover coupled to the upper surface of the housing and including a second hole, wherein the housing comprises: a first region arranged to pass through the first hole; a second region disposed above the first region and arranged to pass through the second hole; and a third region disposed above the second region and placed on the upper surface of the cover.

17 Claims, 14 Drawing Sheets

(56)     References Cited

U.S. PATENT DOCUMENTS

| 2008/0230948 | A1 |  | 9/2008 | Salvador et al. |  |
| 2015/0282351 | A1 |  | 10/2015 | Bonvallat et al. |  |
| 2020/0053888 | A1 | * | 2/2020 | Best | H05K 5/13 |

FOREIGN PATENT DOCUMENTS

| CN | 105379438 | A | 3/2016 |
| CN | 110463366 | A | 12/2019 |
| CN | 210259486 | U | 4/2020 |
| EP | 2 840 667 | B1 | 5/2018 |
| KR | 10-2016-0141480 | A | 12/2016 |
| KR | 10-2020-0045663 | A | 5/2020 |
| KR | 10-2020-0085602 | A | 7/2020 |
| KR | 10-2020-0144814 | A | 12/2020 |

OTHER PUBLICATIONS

Supplementary European Search Report dated Mar. 24, 2025 in European Application No. 22788350.1.
Office Action dated Mar. 18, 2026 in Chinese Application No. 202280027630.0.

* cited by examiner (a)        (b)

ELECTRIC/ELECTRONIC EQUIPMENT AND METHOD FOR MANUFACTURING SAME

CROSS-REFERENCE TO RELATED APPLICATIONS

This application is the U.S. national stage application of International Patent Application No. PCT/KR2022/005092, filed Apr. 8, 2022, which claims the benefit under 35 U.S.C. § 119 of Korean Application Nos. 10-2021-0047961, filed Apr. 13, 2021; and 10-2022-0012703, filed Jan. 27, 2022; the disclosures of each of which are incorporated herein by reference in their entirety.

TECHNICAL FIELD

The present embodiment relates to An electric equipment and a method for manufacturing same

BACKGROUND ART

The outer shape of An electric equipment being provided in a vehicle is formed by a housing, and a plurality of electronic components can be disposed inside the housing.

For an example, An electric equipment may include a housing including an inner space, an electronic component being disposed inside the housing, and a cover being coupled to the housing to cover the inner space.

According to the structure as described above, a plurality of fastening structures are required for coupling the housing and the cover and fixing electronic components inside the housing, but there is a problem in that manufacturing cost increases due to an increase in the number of components.

DETAILED DESCRIPTION OF THE INVENTION

Technical Subject

The present embodiment is to provide An electric equipment and a method for manufacturing same capable of reducing manufacturing cost by reducing the number of components for fastening between multiple configurations and enhancing production efficiency by reducing assembly man-hours.

Technical Solution

An electric equipment according to the present embodiment comprises: a housing; a printed circuit board being disposed inside the housing and including a first hole; and a cover being coupled to an upper surface of the housing and including a second hole, wherein the housing includes: a first region being disposed to penetrate through the first hole; a second region being disposed at an upper portion of the first region and being disposed to penetrate through the second hole; and a third region being disposed at an upper portion of the second region and being disposed on an upper surface of the cover.

The cover is more recessed downwardly from an upper surface than the other regions and may include a coupling groove being disposed with the third region inside thereof.

A lower surface of the third region may be in contact with a bottom surface of the coupling groove.

A lower surface of the housing includes a protruded portion being protruded downward, and a lower surface of the protruded portion may be in contact with an upper surface of the printed circuit board.

An accommodating groove being recessed more upward than other regions may be disposed on a lower surface of the protruded portion, and an upper surface of the first region may be in contact with a bottom surface of the accommodating groove.

The cross-sectional area of the first region may be larger than the cross-sectional area of the second region.

A groove being formed along an edge of the second region may be disposed on an upper surface of the first region.

In a method for manufacturing An electric equipment according to the present embodiment comprising: a housing including a first coupling portion being protruded upward from an upper surface; a printed circuit board being disposed at an upper portion of the housing and including a first hole; and a cover comprising a second coupling portion being disposed at an upper portion of the printed circuit board, having a coupling groove being formed on an upper surface, and being protruded upward from a bottom surface of the coupling groove, and a second hole penetrating a lower surface from the bottom surface of the coupling groove, the method comprises the steps of: (a) penetrating through the first hole and the second hole by the first coupling portion; and (b) forming a protrusion inside the coupling groove by fusing the first coupling portion or the second coupling portion with heat or laser.

The height of the first coupling portion being protruded from the bottom surface of the coupling groove may be the same as the height of the second coupling portion being protruded from the bottom surface of the coupling groove.

The height of the first coupling portion being protruded from a bottom surface of the coupling groove may be greater than the height of the second coupling portion being protruded from a bottom surface of the coupling groove.

Advantageous Effects

Since the housing, the cover, and the printed circuit board are coupled to each other through a single protrusion through the present embodiment, there is an advantage in that the number of components is reduced and the fastening process can be performed more simply.

BEST MODE

Hereinafter, preferred embodiments of the present invention will be described in detail with reference to the accompanying drawings.

However, the technical idea of the present invention is not limited to some of the described embodiments and can be implemented in various different forms, and within the scope of the technical idea of the present invention, one or more of the components may be selectively combined or substituted and used between embodiments.

In addition, the terms (including technical and scientific terms) used in the embodiments of the present invention, unless explicitly defined and described, can be interpreted as a meaning that can be generally understood by a person skilled in the art, and commonly used terms such as terms defined in the dictionary may be interpreted in consideration of the meaning of the context of the related technology.

In addition, terms used in the present specification are for describing embodiments and are not intended to limit the present invention. In the present specification, the singular form may include the plural form unless specifically stated in the phrase, and when described as "at least one (or more than one) of A and B and C", it may include one or more of all combinations that can be combined with A, B, and C.

In addition, in describing the components of the embodiment of the present invention, terms such as first, second, A, B, (a), and (b) may be used. These terms are merely intended to distinguish the components from other components, and the terms do not limit the nature, order or sequence of the components.

And, when a component is described as being 'connected', 'coupled' or 'interconnected' to another component, the component is not only directly connected, coupled or interconnected to the other component, but may also include cases of being 'connected', 'coupled', or 'interconnected' due that another component between that other components.

In addition, when described as being formed or arranged in "on (above)" or "below (under)" of each component, "on (above)" or "below (under)" means that it includes not only the case where the two components are directly in contact with, but also the case where one or more other components are formed or arranged between the two components. In addition, when expressed as "on (above)" or "below (under)", the meaning of not only an upward direction but also a downward direction based on one component may be included.

Figure 1:
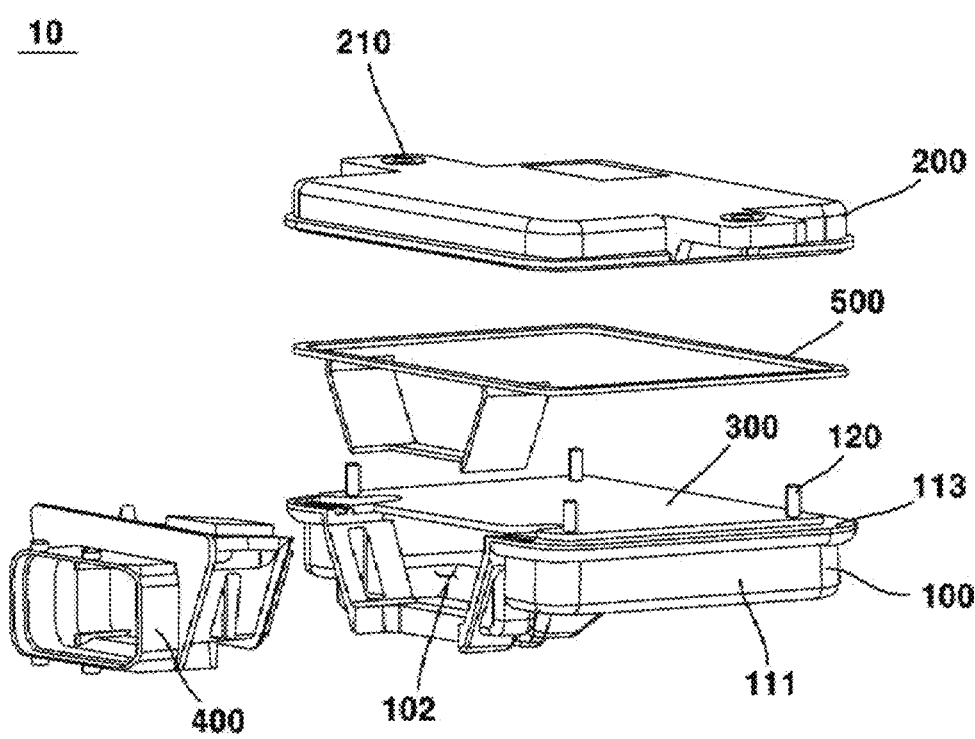
FIG. 1 is an exploded perspective view of An electric equipment according to a first embodiment of the present invention.
Figure 2:
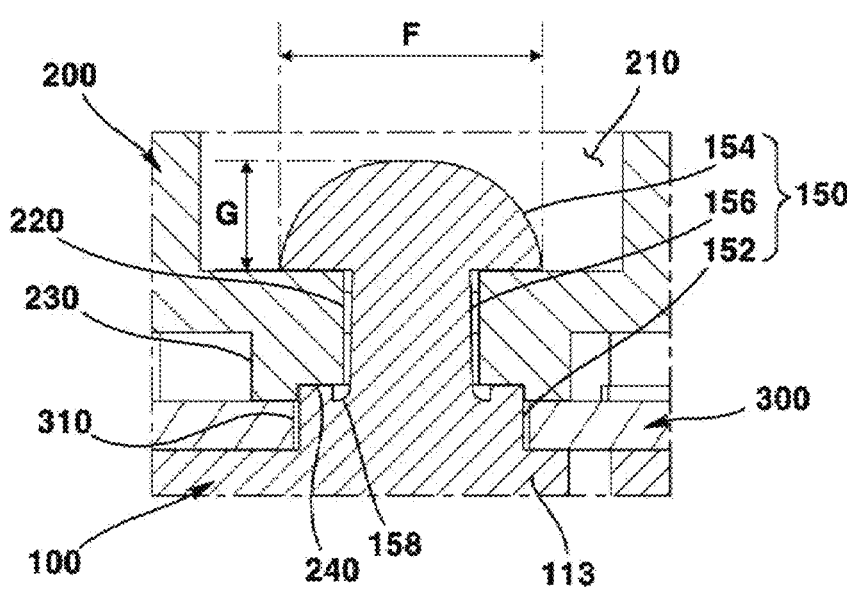
FIG. 2 is a cross-sectional view illustrating a coupling structure of a housing, a cover and a printed circuit board according to a first embodiment of the present invention.
Figure 3:
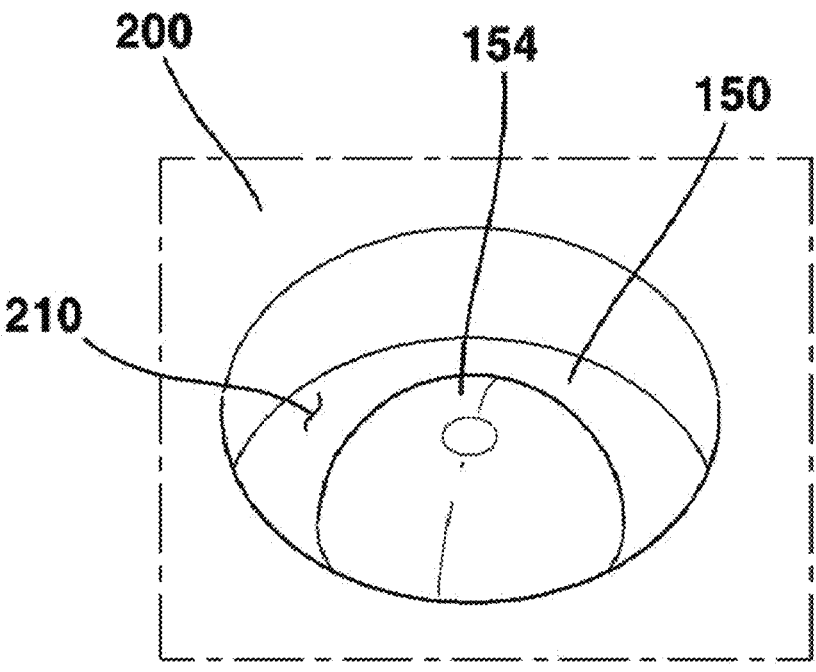
FIG. 3 is a perspective view illustrating a part of an upper surface of the cover according to a first embodiment of the present invention.
Figure 4:
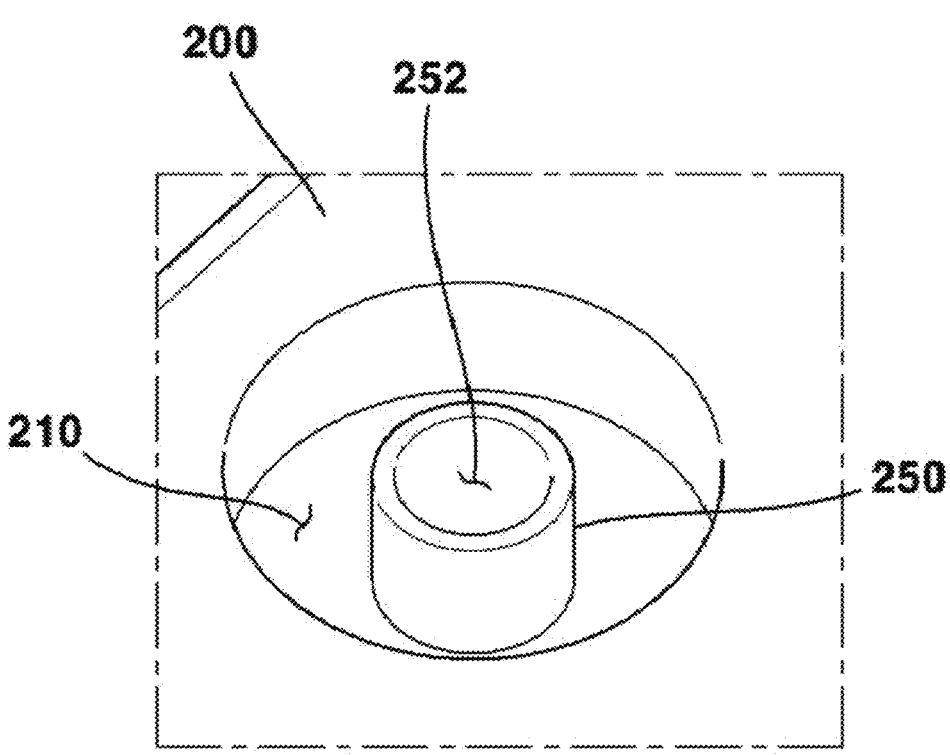
FIG. 4 is a perspective view of a first coupling portion according to a first embodiment of the present invention.
Figure 5:
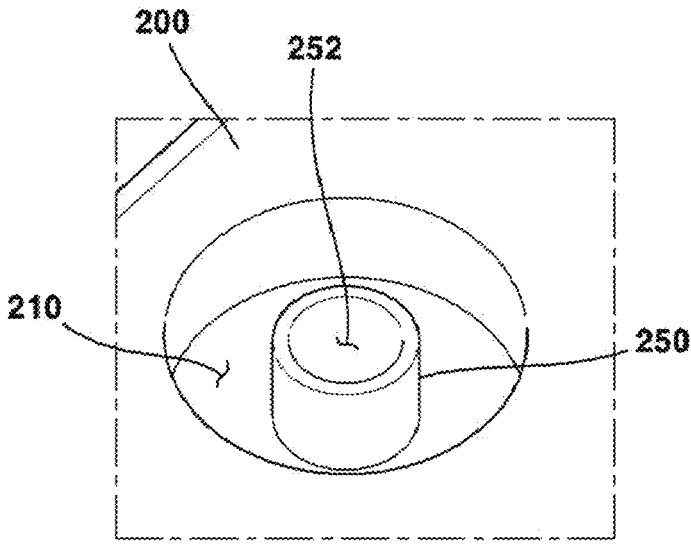
FIG. 5 is a perspective view illustrating a coupling groove of a cover according to a first embodiment of the present invention.
Figure 6:
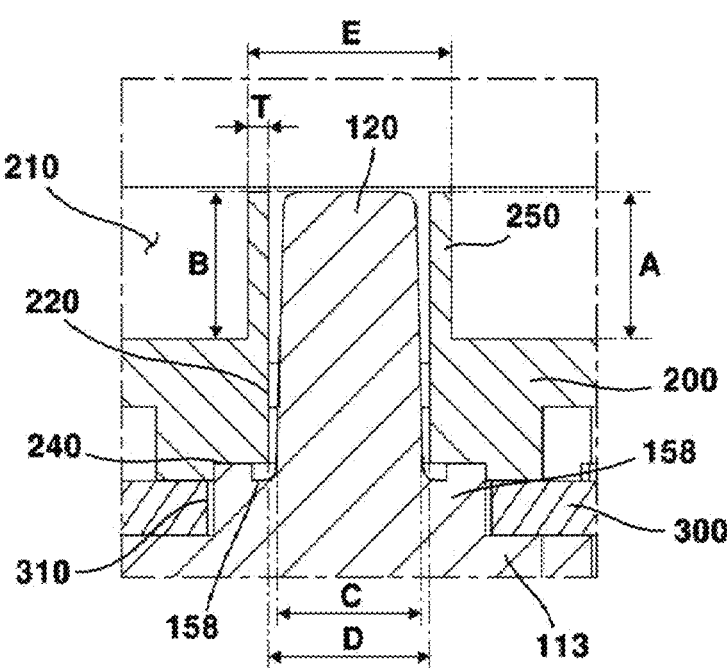
FIG. 6 is a cross-sectional view illustrating a coupling structure of a housing, a cover, and a printed circuit board in An electric equipment before fusion according to a first embodiment of the present invention.
Figure 7:
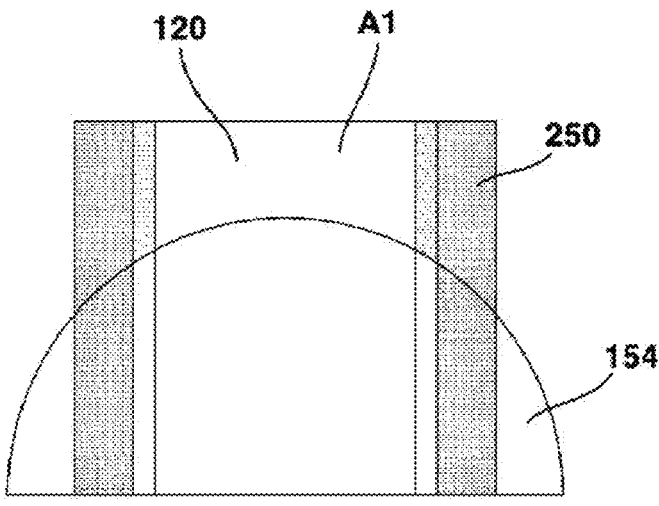
FIG. 7 is a cross-sectional view comparing deformations of a first coupling portion and a second coupling portion before and after fusion according to a first embodiment of the present invention.
Figure 8:
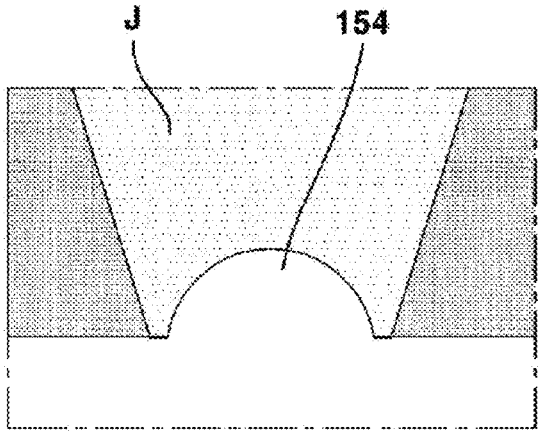
FIG. 8 is a view for explaining the fusion process according to a first embodiment of the present invention.

FIG. 1 is an exploded perspective view of An electric equipment according to a first embodiment of the present invention; FIG. 2 is a cross-sectional view illustrating a coupling structure of a housing, a cover and a printed circuit board according to a first embodiment of the present invention; FIG. 3 is a perspective view illustrating a part of an upper surface of the cover according to a first embodiment of the present invention; FIG. 4 is a perspective view of a first coupling portion according to a first embodiment of the present invention; FIG. 5 is a perspective view illustrating a coupling groove of a cover according to a first embodiment of the present invention; FIG. 6 is a cross-sectional view illustrating a coupling structure of a housing, a cover, and a printed circuit board in An electric equipment before fusion according to a first embodiment of the present invention; FIG. 7 is a cross-sectional view comparing deformations of a first coupling portion and a second coupling portion before and after fusion according to a first embodiment of the present invention; and FIG. 8 is a view for explaining the fusion process according to a first embodiment of the present invention.

FIGS. 1, 4, 5, and 6 are views illustrating a coupled state of An electric equipment before thermal fusion, and FIGS. 2 and 3 are views illustrating a coupled state of An electric equipment after thermal fusion.

Referring to FIGS. 1 to 8, An electric equipment 10 according to a first embodiment of the present invention may have an external shape by coupling the housing 100 and the cover 200.

The housing 100 is formed with a space for accommodating at least one or more components therein, and may have a rectangular cross-sectional shape. The housing 100 may include: a side surface portion 111 forming a side surface, an upper surface portion 113 being bent inwardly at an upper end of the side surface portion 111, and a lower surface portion being bent inwardly at a lower end of the side surface portion 111. An upper surface of the lower portion may form a bottom surface of the space. The upper surface portion 113 may be disposed at an upper edge region of the housing 100 to which the cover 200 is coupled.

A connector 400 being coupled with a terminal (not shown) for connecting The electric equipment 10 and other configurations may be disposed on a side surface of the housing 100. A hole-shaped connector coupling portion 102 penetrating an inner surface from an outer surface so as to be coupled to the connector 400 may be disposed on the side surface portion 111.

The housing 100 may be formed of a plastic material.

The cover 200 may be coupled to an upper surface of the housing 100. Through the coupling of the cover 200, the space inside the housing 100 may be covered from an external region. The cross section of the cover 100 may be formed to correspond to the cross sectional shape of the housing 100. The cover 100 may be formed of a plastic material.

At least one electronic component for driving The electric equipment 10 may be disposed in a space inside the housing 100. The electronic component may include the printed circuit board 300. The printed circuit board 300 is formed in a plate shape and may be coupled to an upper surface of the housing 100. The printed circuit board 300 may be disposed on an upper surface of the upper surface portion 113. In this case, an upper surface of the upper surface portion 113 may be disposed downward to have a step lower than an upper surface of the side surface portion 111 by a predetermined distance. At least one or more elements for driving may be mounted on the printed circuit board 300.

Between the housing 100 and the cover 200 and between the housing 100 and the connector 400, a sealing member 500 may be disposed to inhibit external foreign substances from entering the space inside the housing 100. The sealing member 500 is formed of a rubber material, and may be disposed to seal the regions between the housing 100 and the cover 200 and between the housing 100 and the connector 400.

Hereinafter, a coupling structure of the housing 100, the cover 200 and the printed circuit board 300 will be described.

Referring to FIG. 2, the housing 100, the cover 200 and the printed circuit board 300 may be coupled to each other through a protrusion 150. The protrusion 150 is protruded upward from an upper surface of the upper surface portion 113 of the housing 100 and may be disposed to penetrate through the printed circuit board 300 and the cover 200.

In detail, the protrusion 150 protrudes upward from an upper surface of the upper surface portion 113 of the housing 100 and may include a first region 152, a second region 156, and a third region 154.

The first region 152 is protruded upward from an upper surface of the upper surface portion 113 and may be disposed to penetrate through the printed circuit board 300. A first hole 310 may be formed in the printed circuit board 300 so that the first region 152 penetrates therethrough. A cross-sectional shape of the first hole 310 may be formed to correspond to a cross-sectional shape of the first region 152. The first hole 310 and the first region 152 may have a first cross-sectional area. The cross-sectional area of the first region 152 may be smaller than the cross-sectional area of the first hole 310 so that the outer circumferential surface of the first region 152 may be spaced apart from the inner circumferential surface of the first hole 310 by a predetermined distance. The thickness of the first region 152 in a vertical direction may correspond to or be greater than the thickness of the printed circuit board 300 in a vertical direction. An upper surface of the first region 152 may come into contact with a bottom surface of an accommodating groove 240 in a protruded portion 230 of the cover 200, which will be described later.

The second region 156 may be disposed to connect the first region 152 and the third region 154. The second region 156 may be disposed to penetrate through the cover 200. The cover 200 may include a second hole 220 penetrating through a lower surface from an upper surface and having the second region 156 disposed therein. The cross-sectional shape of the second hole 220 may be formed to correspond to the cross-sectional shape of the second region 156. The second region 156 and the second hole 220 may have a second cross-sectional area. The second cross-sectional area may be smaller than the first cross-sectional area. Unlike this, the cross-sectional area of the second region 156 is smaller than the cross-sectional area of the second hole 220, and of course, an outer circumferential surface of the second region 156 may be spaced apart from an inner circumferential surface of the second hole 220 by a predetermined distance.

A groove 158 being concavely recessed downward than other regions may be formed in a lower edge region of the second region 156 of the upper surface of the first region 152. Accordingly, the other upper region of the first region 152 is in contact with a bottom surface of the receiving groove 240, and a bottom surface of the groove 158 may be spaced apart from a bottom surface of the accommodating groove 240 by a predetermined distance. Assembly tolerances can be secured through the grooves 158, and foreign substances including molten material can be inhibited from being accommodated in the grooves 158 and flowing into other regions in a fusion process, which will to be described later.

A third region 154 may be disposed at an upper portion of the second region 156. The third region 154 may have a dome shape. The third region 154 may be formed in a hemispherical shape. The third region 154 may be disposed on an upper surface of the cover 200. An upper surface of the cover 200 may be recessed downward than other regions, and a coupling groove 210 in which the third region 154 is disposed may be formed therein. A lower surface of the third region 154 is in contact with a bottom surface of the coupling groove 210, and may be a structure in which the second region 156 being extended downward from the third region 154 is disposed inside the second hole 220. An upper surface of the third region 154 may be a curved surface. An upper surface of the third region 154 may be disposed lower than an upper surface of the cover 200.

The third region 154 may be a region in which the first coupling portion 120 of the housing 100, which will be described later, and the second coupling portion 250 of the cover 200 are fused by heat or laser.

The diameter F of the third region 154 may be 4 mm to 6 mm, and the height G from the bottom surface of the coupling groove 210 to an upper end of the third region 154 may be 2 mm to 4 mm. A side surface of the third region 154 may be spaced apart from an inner circumferential surface of the coupling groove 210.

The cover 200 may include: a protruded portion 230 being protruded downward from a lower surface facing the space inside the housing 100; and a second hole 220 penetrating the bottom surface of the coupling groove 210 from the lower surface of the protruded portion 230.

The protruded portion 230 is protruded more downward from a lower surface of the cover 200 than other regions, and a lower surface may come into contact with an upper surface of the printed circuit board 300. The accommodating groove 240 may be disposed in the center of a lower surface of the protruded portion 230 in a shape that is more recessed than other regions, and the accommodating groove 240 is formed to have a cross section corresponding to the cross sectional shape of the first region 152 and can accommodate a portion of an upper end of the first region 152. An upper surface of the first region 152 may be in contact with a bottom surface of the accommodating groove 240.

The coupling groove 210 is disposed on an upper surface of the cover 200 so that the second hole 220 may be formed to penetrate through a bottom surface of the accommodating groove 240 from a bottom surface of the coupling groove 210.

The protrusion 150 is provided in plural and may be disposed to be spaced apart along the edges of the housing 100 and the cover 200.

According to the structure as described above, since the housing, the cover and the printed circuit board are coupled to each other through a single protrusion, there are advantages in that the number of components is reduced and the fastening process can be performed more simply.

Meanwhile, as described above, the protrusion 150 may be a region in which at least a portion of the cover 200 or the housing 100 is fused by heat or laser. Hereinafter, a method of coupling the housing 100, the printed circuit board 300, and the cover 200 will be described.

First, as shown in FIG. 6, a first coupling portion 120 being protruded upward may be disposed on an upper surface of the housing 100 before fusing. The first coupling portion 120 may be disposed to be protruded upward from an upper surface of the upper surface portion 113. The first coupling portion 120 may be disposed to be protruded upward from a bottom surface of the coupling groove 210 through the second hole 220.

And, as shown in FIGS. 5 and 6, a second coupling portion 250 may be disposed inside the coupling groove 210. The second coupling portion 250 may have a shape being protruded upward from a bottom surface of the coupling groove 210. A hole 252 (see FIG. 5) may be formed inside the second coupling portion 250 so that the first coupling portion 120 is disposed.

The protrusion height B of the first coupling portion 120 from a bottom surface of the coupling groove 210 may be formed to be corresponding to or larger than the protruding height A of the second coupling portion 250 from a bottom surface of the coupling groove 210. For example, the protruding height A of the second coupling portion 250 from a bottom surface of the coupling groove 210 and the protruding height B of the first coupling portion 120 from a bottom surface of the coupling groove 210 may be formed to be 2 mm to 3 mm, respectively.

Also, the diameter C of the first coupling portion 120 may be 3 mm to 4 mm, and the thickness (E-D)/2 of the second coupling portion 250 may be 0.5 mm to 1 mm. In addition, the diameter of the hole 252 being disposed inside the second coupling portion 250 is larger than the diameter of the first coupling portion 120 so that an outer circumferential surface of the first coupling portion 120 and an inner circumferential surface of the second coupling portion 250 can be spaced apart by a predetermined distance.

Therefore, in a state in which the first coupling portion 120 is disposed to penetrate through the first hole 310 of the printed circuit board 300 and the second hole 220 of the cover 200, when a portion of an upper end of the first coupling portion 120 and a portion of an upper end of the second coupling portion 250 are heated through the fusion jig J as shown in FIG. 8, a third region 154 of the protrusion 150 described above may be formed. At this time, when the housing 100 and the cover 200 are made of the same material, due to the material characteristics, the protrusion 150 and the cover 200 can be firmly coupled to each other with a high fusion rate of the first coupling portion 120 and the second coupling portion 250, and forming of a gap is inhibited from being formed between the cover 200 and the protrusion 150 so there is an advantage in that the space inside the housing 100 can be firmly sealed.

Meanwhile, as shown in FIG. 7, the height of the third region 154 is formed lower than the heights of the first coupling portion 120 and the second coupling portion 250 before fusion, and the cross-sectional area of the third region 154 may be larger than the cross-sectional areas of the first coupling portion 120 and the second coupling portion 250 before fusion.

Figure 9:
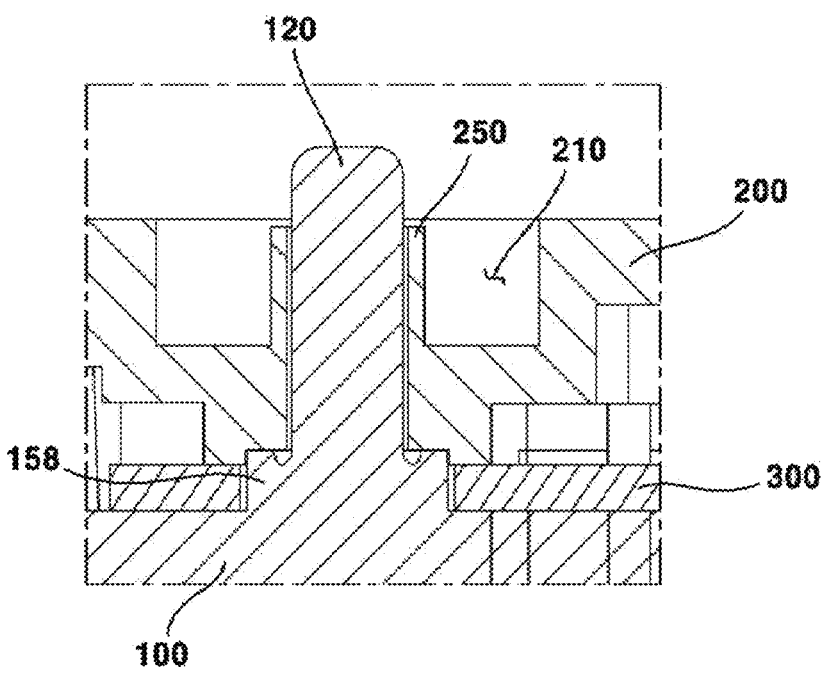
FIG. 9 is a view illustrating a modified embodiment of a first coupling portion and a second coupling portion according to a first embodiment of the present invention.
Figure 10:
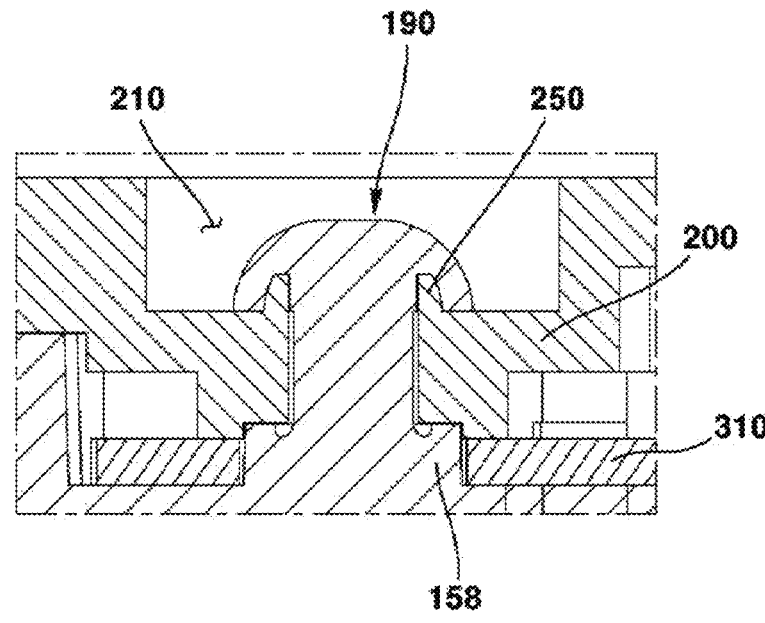
FIG. 10 is a cross-sectional view illustrating a coupling structure of a housing, a cover, and a printed circuit board through fused protrusions according to the shape of FIG. 9.

FIG. 9 is a view illustrating a modified embodiment of a first coupling portion and a second coupling portion according to a first embodiment of the present invention; and FIG. 10 is a cross-sectional view illustrating a coupling structure of a housing, a cover, and a printed circuit board through fused protrusions according to the shape of FIG. 9.

Referring to FIGS. 9 and 10, in a modified embodiment, the protruding height of the first coupling portion 120 from a bottom surface of the coupling groove 210 may be greater than the protruding height of the second coupling portion 250 from a bottom surface of the coupling groove 210. In some cases, the first coupling portion 120 may be disposed further above than an upper surface of the cover 200.

In this case, since the fusion region is relatively more formed in the first coupling portion 120 than in the second coupling portion 250, as shown in FIG. 10, an upper region of the protrusion 190 may be formed in a shape in which the fusion region of the first coupling portion 120 surrounds a portion of the second coupling portion 250.

Figure 11:
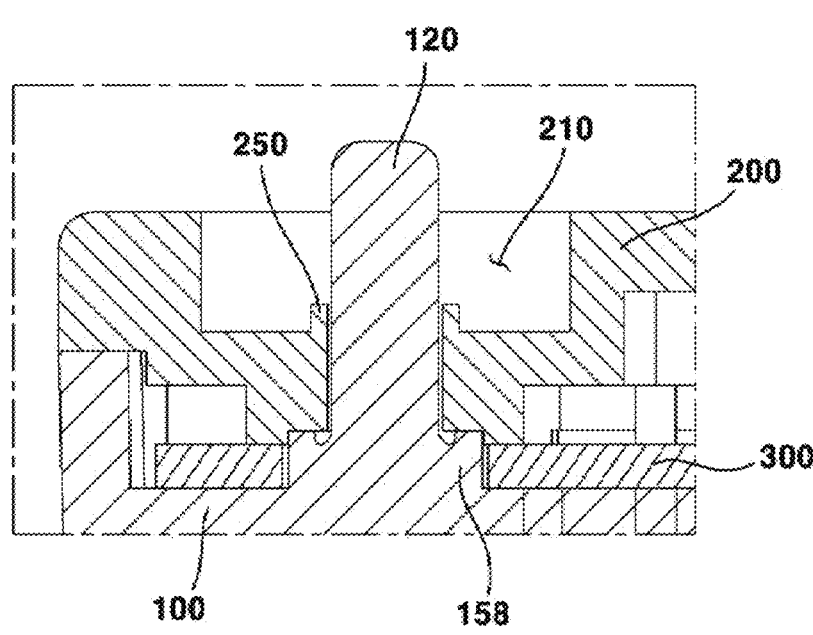
FIG. 11 is a view illustrating another modified embodiment of a first coupling portion and a second coupling portion according to a first embodiment of the present invention.

FIG. 11 is a view illustrating another modified embodiment of a first coupling portion and a second coupling portion according to a first embodiment of the present invention.

Referring to FIG. 11, in a modified embodiment, the protruding height of the first coupling portion 120 from a bottom surface of the coupling groove 210 may be formed to be larger than the protruding height of the second coupling portion 250 from a bottom surface of the coupling groove 210. Unlike the previous modified embodiment, in the modified embodiment, the protruding height of the second coupling portion 250 from a bottom surface of the coupling groove 210 may be formed to be smaller than ½ of the protruding height of the first coupling portion 120 from a bottom surface of the coupling groove 210. In this case, most of the fusion region is formed in the first coupling portion 120, and an upper end of the protrusion may be formed in a shape in which the fusion region of the first coupling portion 120 surrounds the outer surface of the second coupling portion 250.

In a modified embodiment, the coupling force is somewhat weaker, but it is characterized in that the fusion process can be performed more conveniently.

Figure 12:
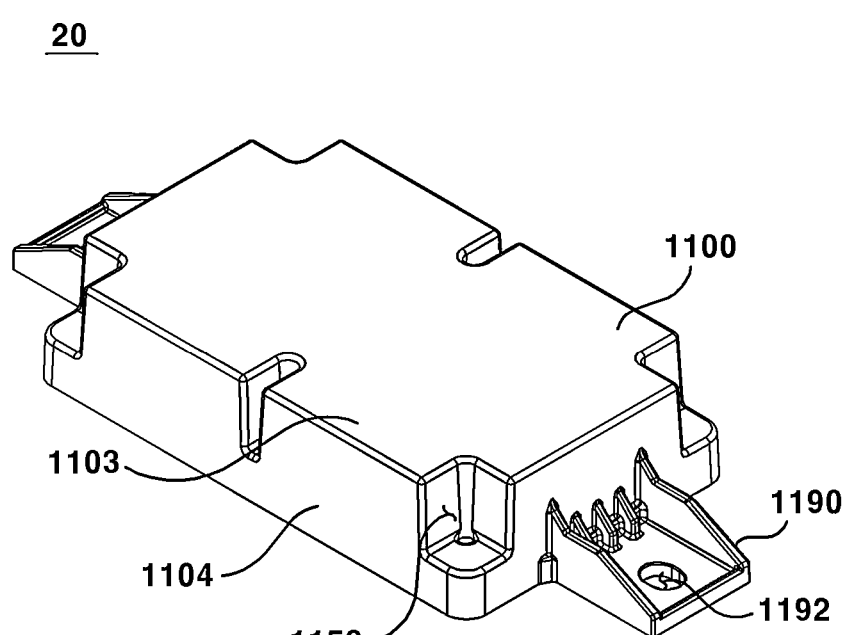
FIG. 12 is a perspective view illustrating an outer appearance of An electric equipment according to a second embodiment of the present invention.
Figure 13:
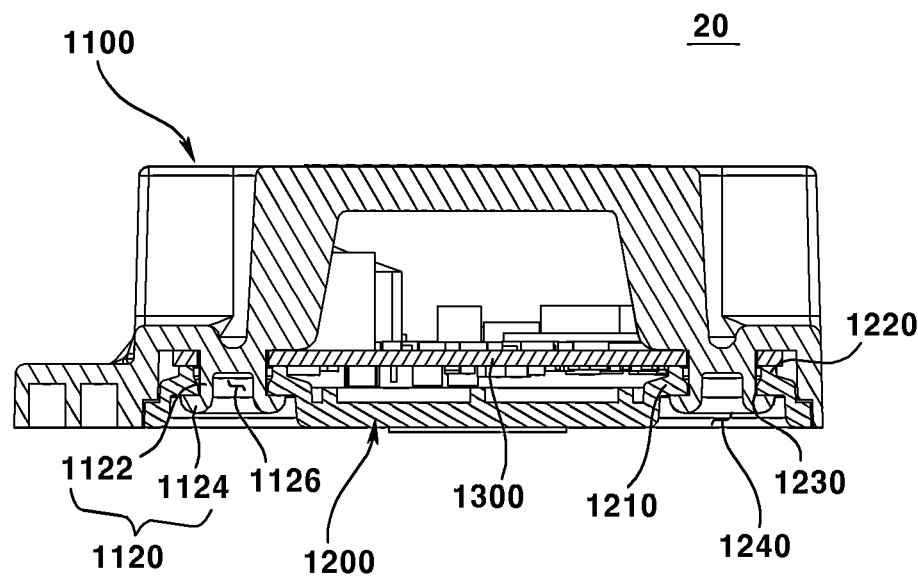
FIG. 13 is a cross-sectional view of An electric equipment according to a second embodiment of the present invention.
Figure 14:
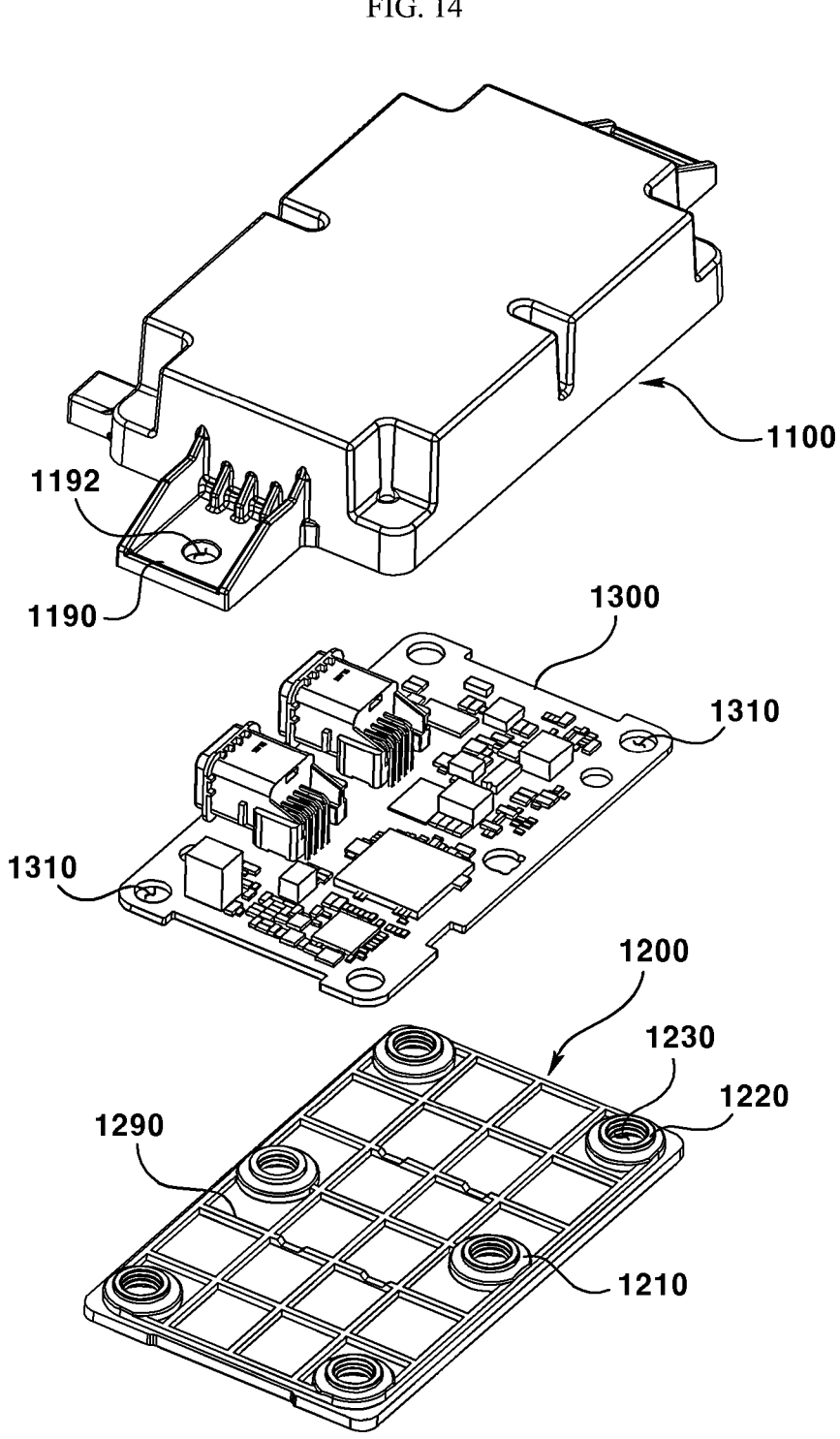
FIG. 14 is an exploded perspective view of An electric equipment according to a second embodiment of the present invention.
Figure 15:
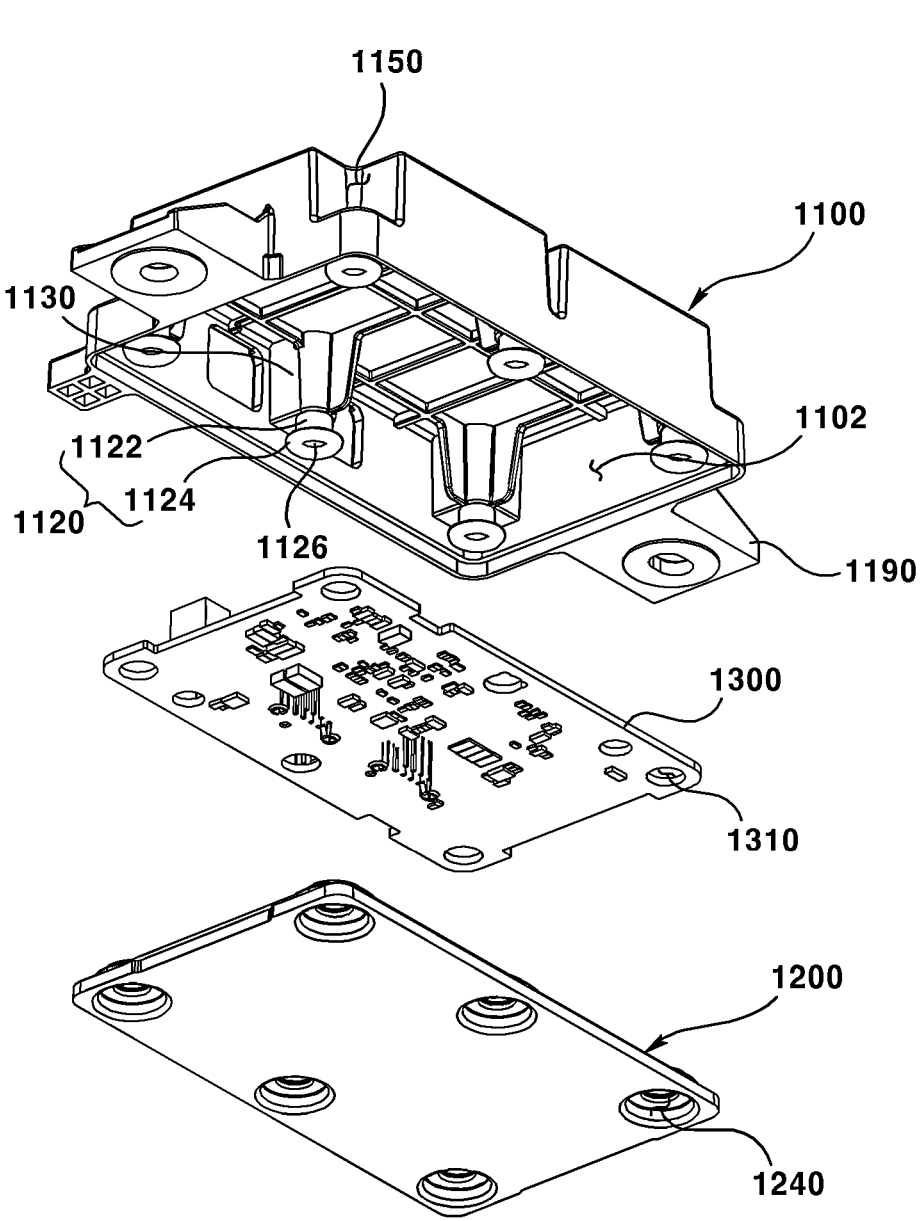
FIG. 15 is a diagram illustrating FIG. 14 from another angle.
Figure 16:
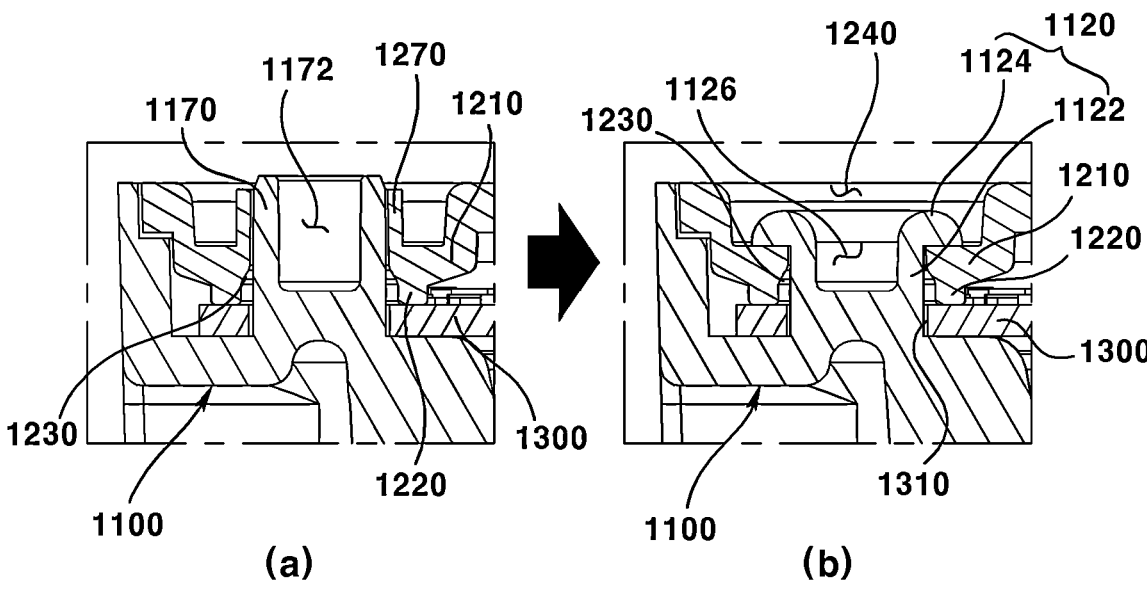
FIG. 16 is a view illustrating an assembly process of a housing, a cover and a printed circuit board according to a second embodiment of the present invention.
Figure 21:
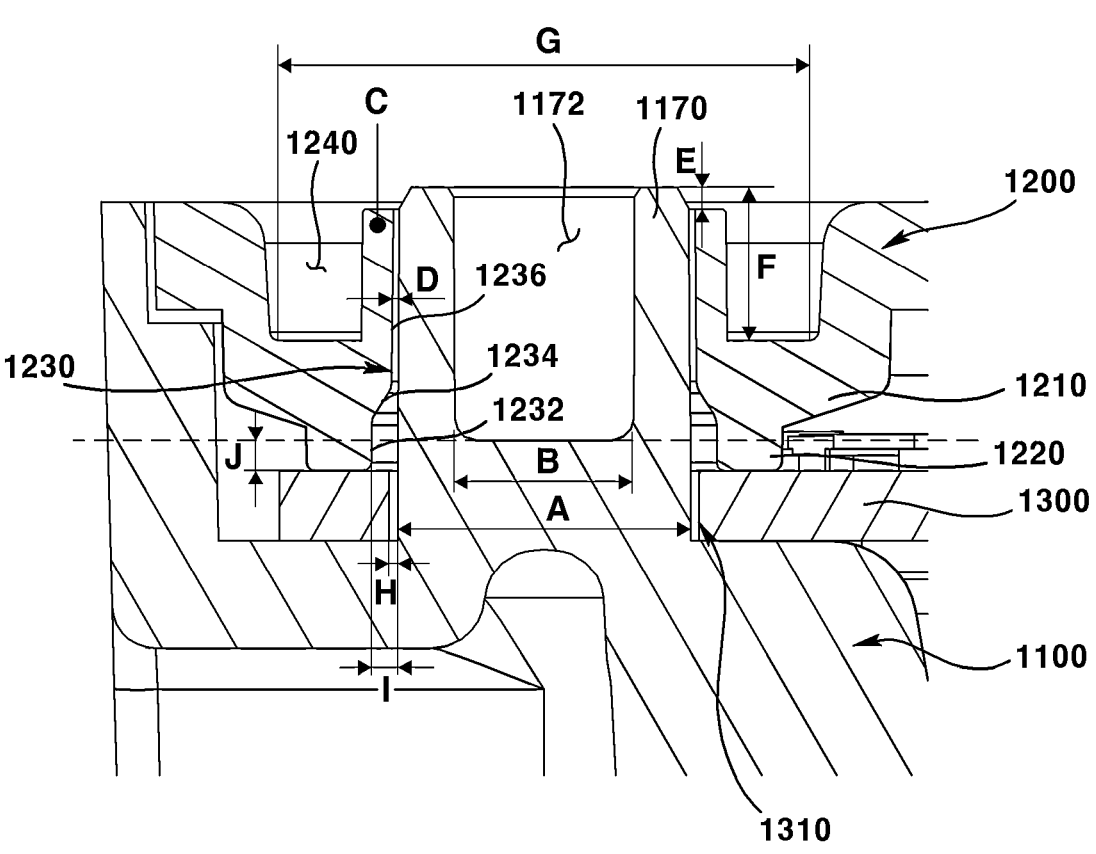
FIG. 21 is a cross-sectional view illustrating a coupling structure of a housing, a cover, and a printed circuit board inside An electric equipment before a fusion process according to a second embodiment of the present invention.
Figure 22:
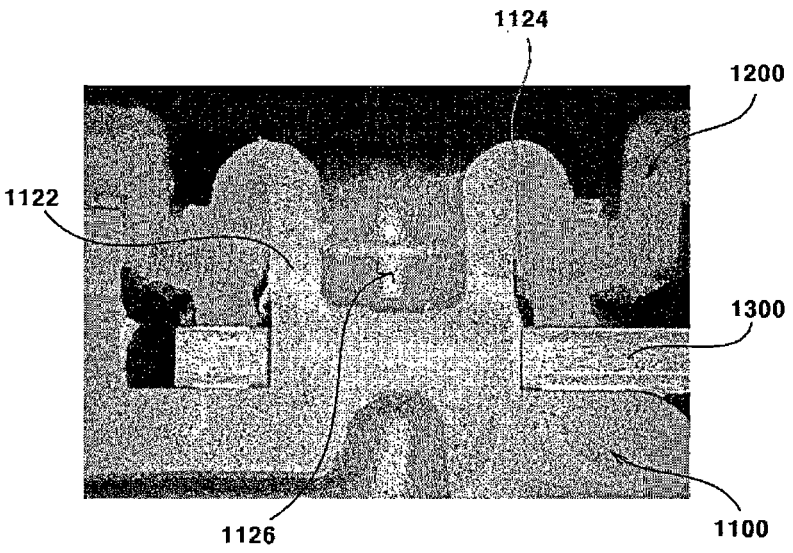
FIG. 22 is a view showing a coupling structure of a housing, a cover, and a printed circuit board after a fusion process according to a second embodiment of the present invention.

FIG. 12 is a perspective view illustrating an outer appearance of An electric equipment according to a second embodiment of the present invention; FIG. 13 is a cross-sectional view of An electric equipment according to a second embodiment of the present invention; FIG. 14 is an exploded perspective view of An electric equipment according to a second embodiment of the present invention; FIG. 15 is a diagram illustrating FIG. 14 from another angle; FIG. 16 is a view illustrating an assembly process of a housing, a cover and a printed circuit board according to a second embodiment of the present invention; FIGS. 17 to 20 are views sequentially illustrating a process of assembling a housing, a cover, and a printed circuit board according to a second embodiment of the present invention; FIG. 21 is a cross-sectional view illustrating a coupling structure of a housing, a cover, and a printed circuit board inside An electric equipment before a fusion process according to a second embodiment of the present invention; and FIG. 22 is a view showing a coupling structure of a housing, a cover, and a printed circuit board after a fusion process according to a second embodiment of the present invention.

Referring to FIGS. 12 to 22, an external shape of An electric equipment 20 according to a second embodiment of the present invention may be formed by coupling the housing 1100 and the cover 1200.

The housing 1100 is formed with a space 1102 for accommodating at least one or more components therein, and may have a rectangular cross-sectional shape. The housing 1100 may include a side surface portion 1104 forming a side surface and an upper surface portion 1103 being bent inwardly from an upper end of the side surface portion 1104 to form an upper surface.

The housing 1100 may include one or more coupling portions 1190. The coupling portion 1190 may have a shape being protruded outwardly from an outer surface of the side surface portion 1104. The coupling portion 1190 may include a coupling hole 1192 penetrating a lower surface from an upper surface. A screw may penetrate through the coupling hole 1192, and thus The electric equipment 20 may be coupled to the installation region.

The housing 1100 may be formed of a plastic material.

The cover 1200 may be disposed at a lower portion of the housing 1100. The cover 1200 may be coupled to a lower surface of the housing 1100. In this embodiment, it is exemplified that the cover 1200 is disposed at a lower portion of the housing 1100, but it is not limited thereto, and the housing 1100 is disposed at a lower portion, and the cover 1200 may be disposed at an upper portion of the housing 1100. By coupling of the cover 1200, a space 1102 inside the housing 1100 can be covered from the outer region. The cover 1200 may have a cross section corresponding to the cross sectional shape of the housing 1100. The cover 1200 may be formed of a plastic material.

A sealing member (not shown) may be disposed between the housing 1100 and the cover 1200 to inhibit external foreign substances from entering the space inside the housing 1100. The sealing member is formed of a rubber material and can seal between the housing 1100 and the cover 1200.

At least one electronic component for driving The electric equipment 20 may be disposed in a space inside the housing 1100. The electronic component may include the printed circuit board 1300. The printed circuit board 1300 is formed in a plate shape and may be coupled to an upper surface of the housing 1100. The printed circuit board 1300 may be disposed between the housing 1100 and the cover 1200. The upper surface of the printed circuit board 1300 may be spaced apart from the lower surface of the upper surface portion 1103 of the housing 1100 by a predetermined distance. At least one or more elements for driving The electric equipment 20 may be mounted on the printed circuit board 1300.

Hereinafter, a coupling structure of the housing 1100, the cover 1200, and the printed circuit board 1300 will be described.

The housing 1100 may include a first protruded portion 1130. The first protruded portion 1130 may be protruded downwardly from a lower surface of the upper surface portion 1103. The first protruded portion 1130 is provided in plurality, and the plurality of first protruded portions 1130 may be spaced apart from one another. For example, some of the plurality of first protruded portions 1130 are respectively disposed in corner regions of the housing 1100, and other portion may be disposed between one corner of the housing 1100 and another corner adjacent to the one corner. In a region corresponding to the region being formed with the first protruded portion 1130 among the upper surface of the housing 1100, a groove 1150 in a shape being recessed more downward than other regions may be formed.

A lower surface of the first protruded portion 1130 may be in contact with an upper surface of the printed circuit board 1300.

The cover 1200 may include a second protruded portion 1210 being protruded upward from an upper surface facing the housing 1100. The second protruded portion 1210 may have a shape being protruded more upwardly from an upper surface of the cover 1200 than other regions. The second protruded portion 1210 is provided in plurality, and the plurality of second protruded portions 1210 may be spaced apart from one another. The plurality of second protruded portions 1210 may be disposed to be overlapped with the plurality of first protruded portions 1130 in an up and down direction. The second protruded portion 1210 may have a circular cross-sectional shape.

A third protruded portion 1220 being protruded more upwardly than other regions may be formed on an upper surface of the second protruded portion 1210. An upper surface of the third protruded portion 1220 may be in contact with a lower surface of the printed circuit board 1300. The third protruded portion 1220 may have a ring-shaped cross-section. Therefore, the printed circuit board 1300 can be firmly fixed inside the space 1102 by the lower surface of the first protruded portion 1130 and the upper surface of the third protruded portion 1220.

In a lower surface of the cover 1200, in a region corresponding to a region in which the second protruded portion 1210 is formed, a first groove 1240 in a shape being recessed more upwardly than other regions may be formed. The bottom surface of the first groove 1240 may be disposed to have a step more upwardly than the lower surface of the cover 1200.

The cover 1200 may include a first hole 1230. The first hole 1230 may be formed to penetrate through a lower surface of the cover 1200 from an upper surface. The first hole 1230 may be formed inside the second protruded portion 1210. The first hole 1230 may have a shape penetrating through a bottom surface of the first groove 1240 from an upper surface of the second protruded portion 1210. The cross-sectional area of the first hole 1230 may be smaller than the cross-sectional area of the first groove 1240.

The first hole 1230 may include two or more regions having different cross-sectional areas. For example, as illustrated in FIG. 21, the first hole 1230 may include: a first-first hole 1232 having a first diameter; and a first-second hole 1234 having a second diameter smaller than the first diameter. The first-first hole 1232 and the first-second hole 1234 are disposed in an up and down direction and may communicate with each other. The first-second hole 1234 may be disposed below the first-first hole 1232.

An inclined surface 1236 having a shape in which the cross-sectional area decreases as it travels toward a lower direction may be formed between the first-first hole 1232 and the first-second hole 1234 among an inner surface of the first hole 1230.

The printed circuit board 1300 may include a second hole 1310. The second hole 1310 may be formed to penetrate from an upper surface to a lower surface of the printed circuit board 1300. The second hole 1310 may be formed to have a cross-sectional area smaller than that of the first hole 1230, but is not limited thereto. For example, the diameter of the second hole 1310 is smaller than the diameter of the first-first hole 1232, and may be greater than or equal to the diameter of the first-second hole 1234. The second hole 1310 may be disposed to face the first hole 1230 in an up and down direction.

The housing 1100 may include a protrusion 1120. The protrusion 1120 may have a shape being protruded downward from a lower surface of the first protruded portion 1130. The protrusion 1120 may be disposed to penetrate through the second hole 1310 of the printed circuit board 1300 and the first hole 1230 of the cover 1200.

In detail, the protrusion 1120 may include a first region 1122 being protruded downward from a lower surface of the first protruded portion 1130 and a second region 1124 being disposed at a lower end of the first region 1122. The first region 1122 may be disposed inside the first hole 1230 and the second hole 1310, and the second region 1124 may be disposed in the first groove 1240. An upper surface of the second region 1124 may be in contact with a bottom surface of the first groove 1240. The cross-sectional area of the second region 1124 may be larger than the cross-sectional area of the first region 1122.

A lower end of the protrusion 1120, that is, an end surface of the second region 1124, that is, a lower surface, may be a curved surface having a predetermined curvature. The second region 1124 may have a donut shape.

A second groove 1126 may be formed on a lower surface of the protrusion 1120 in a shape being recessed more upwardly than other regions. A bottom surface of the second groove 1126, that is, an upper end of the second groove 1126 may be disposed at a lower side than a lower surface of the printed circuit board 1300.

The protrusion 1120 may be a region being formed when the housing 1100 and the cover 1200 are fused by heat or laser fusion. In the protrusion 1120, the second region 1124 may be a region fused by heat or laser.

Hereinafter, a process of assembling the housing 1100, the cover 1200, and the printed circuit board 1300 will be described.

The housing 1100, the cover 1200, and the printed circuit board 1300 may be coupled to one another by heat or laser fusion.

Before thermal fusion, the housing 1100, the cover 1200, and the printed circuit board 1300 may be assembled as shown in FIG. 21. FIG. 21 illustrates the housing 1100, the cover 1200, and the printed circuit board 1300 by interchanging the up and down directions, and for convenience of description, the region being protruded downward from a lower surface of the first protruded portion 1130 of the housing 1100 before the fusion process is referred to as a first coupling portion 1170, and a region being protruded downward from a lower surface of the cover 1200 before the fusion process is referred to as a second coupling portion 1270 and will be described. To form the second groove 1126, a groove 1172 is formed inside the first coupling portion 1170, and the second coupling portion 1270 moves downward from the bottom surface of the first groove 1240 so that a hole to which the first coupling portion 1170 is coupled may be formed inside.

Figure 17:
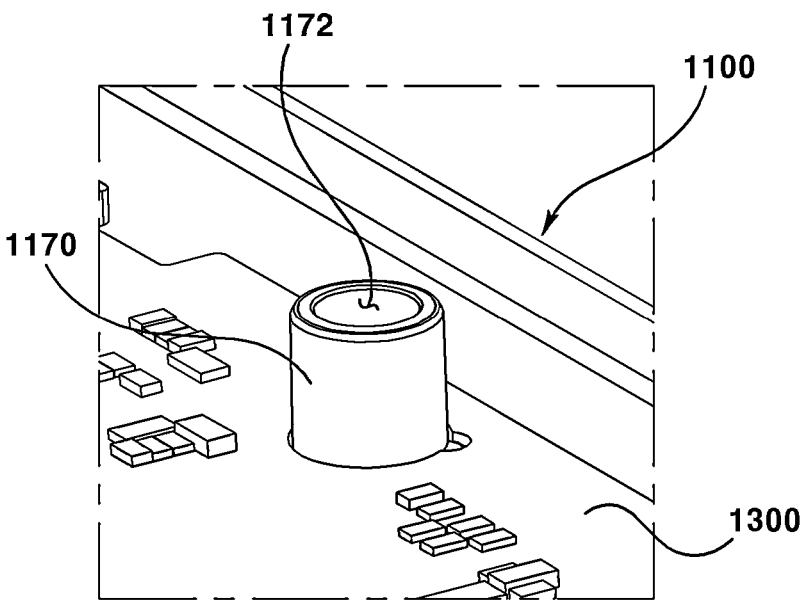
FIGS. 17 to 20 are views sequentially illustrating a process of assembling a housing, a cover, and a printed circuit board according to a second embodiment of the present invention.

First, as illustrated in FIG. 17, the second hole 1310 of the printed circuit board 1300 is coupled to the first coupling portion 1170 of the housing 1100. Accordingly, the printed circuit board 1300 may be primarily fixed in a state of being in contact with a lower surface of the first protruded portion 1130.

Figure 18:
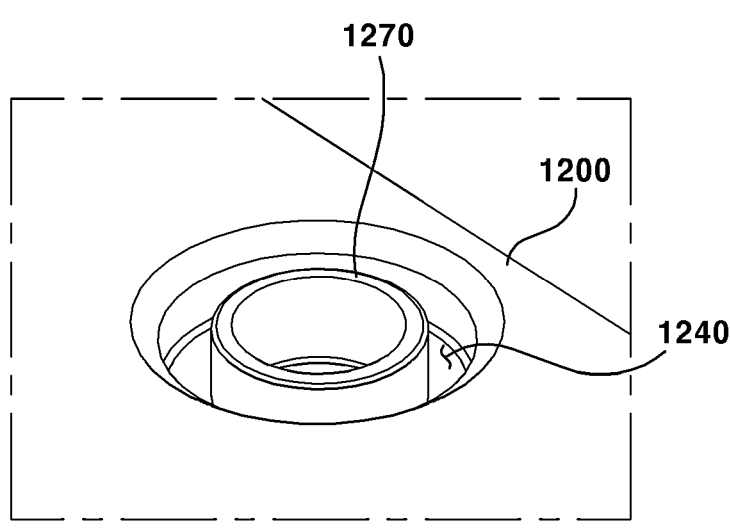
Figure 19:
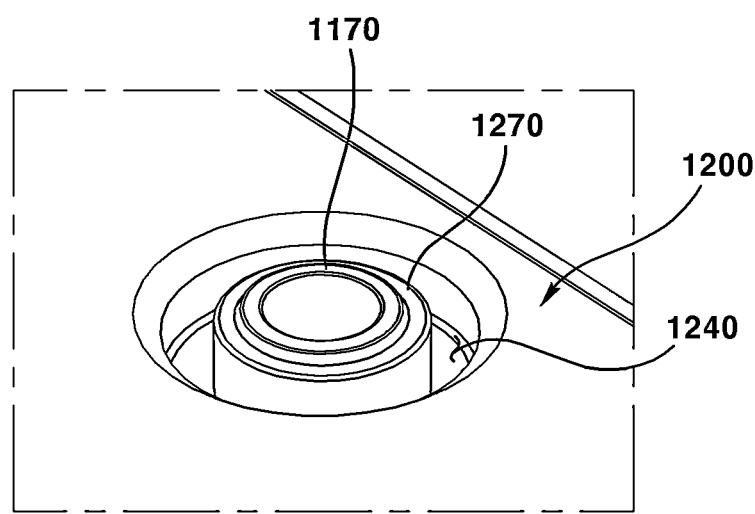

Next, as illustrated in FIGS. 18 and 19, the first coupling portion 1170 coupled to the printed circuit board 1300 is coupled to the inside of the second coupling portion 1270. At this time, a lower end of the first coupling portion 1170 may be protruded lower than a lower end of the second coupling portion 1270. The coupled state illustrated as a cross-sectional view in FIG. 16(a), FIG. 19, is the same as in FIG. 21.

Figure 20:
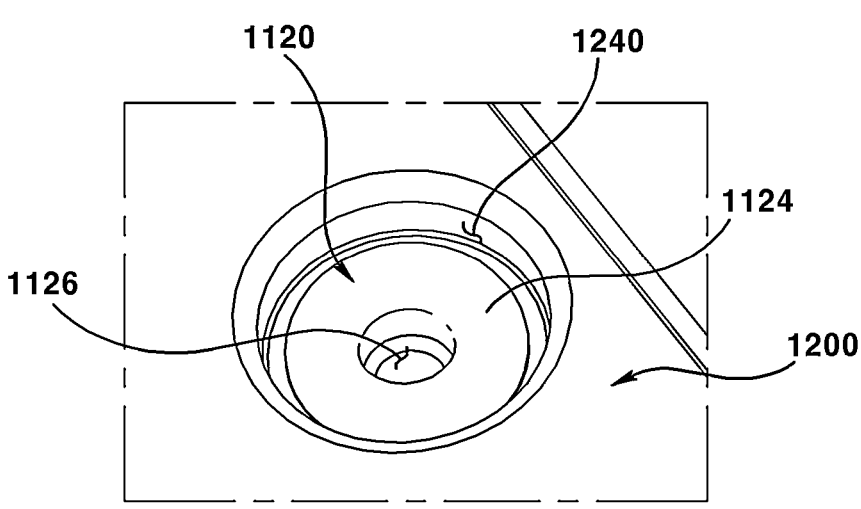

Next, as shown in FIG. 20, the first coupling portion 1170 and the second coupling portion 1270 are fused using heat or laser. Accordingly, the protrusion 1120 may be formed as shown in FIG. 13 and FIG. 16(b). That is, the protrusion 1120 may be formed by curing a fusion material of the first coupling portion 1170 and the second coupling portion 1270.

According to the above structure, since the housing 1100, the cover 1200, and the printed circuit board 1300 can be coupled together by a fusion process, there are advantages in that the number of components for coupling is reduced, and the fastening process can be accomplished more simply.

In addition, as shown in FIG. 22, since the occurrence of a gap between the housing 1100 and the cover 1200 is inhibited by the fusion process, the coupling force between the housing 1100 and the cover 1200 may be accomplished more firmly. In other words, since a gap is inhibited from being generated between an outer circumferential surface of the first region 1122 inside the protrusion 1120 and the inner circumferential surface of the first hole 1230, the coupled state between the housing 1100 and the cover 1200 can be maintained more firmly.

As illustrated in FIG. 21, for a strong fusion force between the housing 1100 and the cover 1200 through the fusion process, the diameter A of the first coupling portion 1170 before the fusion process may be smaller than the diameter of the second hole 1310 in the printed circuit board 1300. Accordingly, a gap H may be formed between an outer surface of the first coupling portion 1170 and an inner surface of the second hole 1310 in the printed circuit board 1300.

In addition, the diameter A of the first coupling portion 1170 before the fusion process may be smaller than the diameter of the hole in the second coupling portion 1270. Accordingly, a gap D may be formed between an outer surface of the first coupling portion 1170 and an inner surface of the hole in the second coupling portion 1270.

In addition, the gap D between the outer circumferential surface of the first coupling portion 1170 and the inner surface of the hole of the second coupling portion 1270 before the fusion process may be smaller than the gap H between the outer circumferential surface of the first coupling portion 1170 and the inner surface of the second hole 1310 before the fusion process.

In addition, the gap E between the lower end of the first coupling portion 1170 and the lower end of the second coupling portion 1270 before the fusion process may be smaller than $\frac{1}{5}$ of the height F of the second coupling portion 1270 being protruded from the bottom surface of the first groove 1240. In addition, the diameter B of the groove 1172 in the first coupling portion 1170 before the fusion process may be larger than $\frac{1}{2}$ of the diameter A of the first coupling portion 1170.

In the above description, it is described that all the components constituting the embodiments of the present invention are combined or operated in one, but the present invention is not necessarily limited to these embodiments. In other words, within the scope of the present invention, all of the components may be selectively operated in combination with one or more. In addition, the terms "comprise", "include" or "having" described above mean that the corresponding component may be inherent unless specifically stated otherwise, and thus it should be construed that it does not exclude other components, but further include other components instead. All terms, including technical and scientific terms, have the same meaning as commonly understood by one of ordinary skill in the art unless otherwise defined. Terms used generally, such as terms defined in a dictionary, should be interpreted to coincide with the contextual meaning of the related art, and shall not be interpreted in an ideal or excessively formal sense unless explicitly defined in the present invention.

The above description is merely illustrative of the technical idea of the present invention, and those skilled in the art to which the present invention pertains may make various modifications and changes without departing from the essential characteristics of the present invention. Therefore, the embodiments disclosed in the present invention are not intended to limit the technical idea of the present invention but to describe the present invention, and the scope of the technical idea of the present invention is not limited by these embodiments. The protection scope of the present invention should be interpreted by the following claims, and all technical ideas within the equivalent scope should be interpreted as being included in the scope of the present invention.

The invention claimed is:

1. An electric equipment comprising:

a housing;

a printed circuit board disposed inside the housing and including a first hole; and a cover coupled to an upper surface of the housing and including a second hole, wherein the housing includes:

a first region disposed to penetrate through the first hole;

a second region disposed at an upper portion of the first region and disposed to penetrate through the second hole; and a third region disposed at an upper portion of the second region and disposed on an upper surface of the cover, wherein a lower surface of the cover includes a protruded portion protruded downward, and a lower surface of the protruded portion is in contact with an upper surface of the printed circuit board, wherein an accommodating groove that is recessed more upward than the first, second, and third regions is disposed on a lower surface of the protruded portion, and wherein an upper surface of the first region is in contact with a bottom surface of the accommodating groove.

2. The electric equipment according to claim 1, wherein the cover is more recessed downwardly from an upper surface than the first, second, and third regions and includes a coupling groove with the third region disposed inside thereof.

3. The electric equipment according to claim 2, wherein a lower surface of the third region is in contact with a bottom surface of the coupling groove.

4. The electric equipment according to claim 2, wherein a side surface of the third region is spaced apart from an inner surface of the coupling groove.

5. The electric equipment according to claim 1, wherein a cross-sectional area of the first region is larger than a cross-sectional area of the second region.

6. The electric equipment according to claim 1, wherein a groove being formed along an edge of the second region is disposed on an upper surface of the first region.

7. The electric equipment according to claim 1, wherein the housing and the cover comprise plastic.

8. The electric equipment according to claim 7, wherein the third region is a fused area.

9. The electric equipment according to claim 1, wherein a thickness of the first region is greater than a thickness of the printed circuit board.

10. The electric equipment according to claim 1, wherein an upper surface of the third region is disposed below an upper surface of the cover.

11. The electric equipment according to claim 1, wherein the housing includes a side portion, a lower surface portion disposed at a bottom of the side portion, and an upper surface portion disposed at an upper end of the side portion, and wherein the first region protrudes upward from the upper surface of the upper surface portion.

12. The electric equipment according to claim 1, wherein the third region has a hemispherical shape.

13. The electric equipment according to claim 1, wherein at least a portion of the cover is disposed in the third region.

14. A method for manufacturing an electric equipment comprising:

a housing including a first coupling portion protruded upward from an upper surface; a printed circuit board disposed at an upper portion of the housing and including a first hole; and a cover comprising a second coupling portion disposed at an upper portion of the printed circuit board, having a coupling groove formed on an upper surface and protruded upward from a bottom surface of the coupling groove, and a second hole penetrating a lower surface from the bottom surface of the coupling groove, wherein the method comprises the steps of:

(a) penetrating through the first hole and the second hole by the first coupling portion; and (b) forming a protrusion inside the coupling groove by fusing the first coupling portion or the second coupling portion with heat or laser, and wherein a height of the first coupling portion protruded from the bottom surface of the coupling groove is the same as a height of the second coupling portion protruded from the bottom surface of the coupling groove.

15. The method for manufacturing an electric equipment according to claim 14, wherein a fusion area of the first coupling portion surrounds the second coupling portion.

16. A method for manufacturing an electric equipment comprising: a housing including a first coupling portion protruded upward from an upper surface; a printed circuit board disposed at an upper portion of the housing and including a first hole; and a cover comprising a second coupling portion disposed at an upper portion of the printed circuit board, having a coupling groove formed on an upper surface and protruded upward from a bottom surface of the coupling groove, and a second hole penetrating a lower surface from the bottom surface of the coupling groove, wherein the method comprises the steps of:

(a) penetrating through the first hole and the second hole by the first coupling portion; and (b) forming a protrusion inside the coupling groove by fusing the first coupling portion or the second coupling portion with heat or laser, and wherein a height of the first coupling portion protruded from a bottom surface of the coupling groove is greater than a height of the second coupling portion protruded from a bottom surface of the coupling groove.

17. A method for manufacturing an electric equipment comprising: a housing including a first coupling portion protruded upward from an upper surface; a printed circuit board disposed at an upper portion of the housing and including a first hole; and a cover comprising a second coupling portion disposed at an upper portion of the printed circuit board, having a coupling groove formed on an upper surface and protruded upward from a bottom surface of the coupling groove, and a second hole penetrating a lower surface from the bottom surface of the coupling groove, wherein the method comprises the steps of:

(a) penetrating through the first hole and the second hole by the first coupling portion; and (b) forming a protrusion inside the coupling groove by fusing the first coupling portion or the second coupling portion with heat or laser, and wherein a protruding height of the second coupling portion from a bottom surface of the coupling groove is less than ½ of a protruding height of the first coupling portion from the bottom surface of the coupling groove.

\* \* \* \* \*